United States Patent [19]

Yamashita et al.

[11] Patent Number: 5,320,218
[45] Date of Patent: Jun. 14, 1994

[54] CLOSED CONTAINER TO BE USED IN A CLEAN ROOM

[75] Inventors: Teppei Yamashita; Masanao Murata; Tsuyoshi Tanaka; Teruya Morita; Hitoshi Kawano; Atsushi Okuno; Masanori Tsuda; Mitsuhiro Hayashi, all of Ise, Japan

[73] Assignee: Shinko Electric Co., Ltd., Tokyo, Japan

[21] Appl. No.: 42,644

[22] Filed: Apr. 5, 1993

[30] Foreign Application Priority Data

Apr. 7, 1992 [JP] Japan .................... 4-84411

[51] Int. Cl.⁵ ............................ B65B 1/04; H01L 21/00
[52] U.S. Cl. .................... 206/213.1; 206/454; 211/41; 118/500; 141/98; 141/67; 414/935
[58] Field of Search ............ 206/454, 455, 213.1; 211/41; 118/500; 414/217, 221, 225, DIG. 1, DIG. 3, DIG. 4, DIG. 5, DIG. 6; 141/98, 95, 91, 67, 70

[56] References Cited

U.S. PATENT DOCUMENTS

| 4,724,874 | 2/1988 | Parikh et al. |
| 4,797,054 | 1/1989 | Arii .................... 414/217 |
| 4,920,920 | 5/1990 | Shigeki ............... 118/500 X |
| 5,074,736 | 12/1991 | Ishii .................. 206/454 X |

FOREIGN PATENT DOCUMENTS 0242771 9/1990 Japan.

Primary Examiner—Paul T. Sewell
Assistant Examiner—Jacob K. Ackun, Jr.
Attorney, Agent, or Firm—Bacon & Thomas

[57] ABSTRACT

A wafer storing, closed container for use in a clean room of a semiconductor manufacturing system is provided with an attached inert gas tank so as to eliminate the need to convey the container to an inert gas purge station to supplement the inert gas supply in the container due to leakage. A gas passageway is formed in a body of the container in such a manner that one end thereof is open inside the container. The other end is open outside the container. The portable inert gas tank is detachably connected to the other end of the gas passageway so as to automatically supplement the container with the inert gas.

4 Claims, 2 Drawing Sheets

CLOSED CONTAINER TO BE USED IN A CLEAN ROOM

BACKGROUND OF THE INVENTION

This invention relates to a closed container used in a semiconductor manufacturing system, in a clean room, for manufacturing semiconductor wafers, liquid crystal display boards, reticles, disks, etc.

One example of a semiconductor manufacturing system of this type is as shown in FIG. 3. In FIG. 3, reference numeral 1 designates a surface treatment equipment incorporating a surface treatment oven or furnace for providing surface treatment to semiconductor wafers, the equipment 1 having two ports (described later) arranged in parallel; 2, a wafer inspecting device; 3, a self-running type positioning robot; 4, a wafer storehouse; 4A, the apron of the wafer storehouse 4; 5, a wafer washing device; and 6, a linear motor conveyor.

FIG. 4 is a sectional view showing a part of the aforementioned surface treatment equipment 1. In FIG. 4, reference numeral 10 designates a closed container with an opening 11 which is sealingly closed through a seal 12 with a lid 13. The lid incorporates an automatic locking mechanism (not shown) with a rod 14. The rod 14 is moved back and forth, so that its end is engaged with the opening 11 of the container 10. Further in FIG. 4, reference numeral 15 designates a wafer cassette, in which a plurality of semiconductor wafers W (for instance twenty-five semiconductor wafers W) are set one above another. The wafer cassette 15 is set in the container 10 when conveyed. FIG. 4 shows the container 10 including the wafer cassette 15 which container is placed on a plate 16 of the surface treatment device 1. The plate 16 forms the abovedescribed port (or cassette taking-in-and-out port) 16A. The container 10 is locked onto the plate 16 with lever-type locking mechanisms 17, and thereupon the self-locking mechanism of the lid 13 is released. The wafer cassette 15 together with the lid 13 is placed on the stand 18 of a lift 18 and moved downwardly, and then only the wafer cassette 15 is conveyed to the surface treatment oven (not shown) by the conveyor (not shown). After the surface treatment of the semiconductor wafers has been accomplished, the wafer cassette 15 is moved back to the lid 13 set on the lift stand 18A. Thereafter, the lift stand 18A is moved upwardly, so that the wafer cassette 15 is brought into the container 10. Under this condition, the lid 13 is locked; that is, the container 10 is closed with the lid 13 thus locked. The container 10 thus closed is moved into the wafer storehouse 4 through the apron 4A by the robot 3. In the wafer storehouse 4, a stacking crane 7 is operated to set the container 10 at a predetermined position on a shelf specified by a central control device (not shown).

Semiconductor wafers or the like should be free from dust. Therefore, a semiconductor manufacturing process is carried out in a clean room having a clean atmosphere, and heretofore the wafer cassette 15 is not covered when conveyed from one processing device to another. However, as the integration of semiconductor circuits is improved, the wafer cassette 15 is handled as follows: That is, the wafer cassette 15 is set in the closed container 10 before moved between processing devices. In addition, the closed container 10 is filled with inert gas, to suppress the formation of natural oxide films on the semiconductor wafers.

The container is held closed. However, if it is left for a long time after being filled with an inert gas such as $N_2$ gas, the gas leaks gradually, so that the density of $N_2$ gas in the container is decreased.

Therefore, in the case where it is required for the container to have a high purity $N_2$ gas atmosphere, or the container is held in the storehouse for a long time, it is necessary to supplement the container with more gas. For this purpose, the container is conveyed to the $N_2$ gas purge station every predetermined period of time, and gas-purged. This makes the system intricate in operation.

SUMMARY OF THE INVENTION

Accordingly, an object of this invention is to eliminate the above-described difficulty accompanying a conventional closed container. More specifically, an object of the invention is to provide a closed container used in a clean room which has a gas supply source detachably connected to it, and is therefore free from the difficulty that it is necessary to convey the container to the $N_2$ gas purge station to supplement it with $N_2$ gas.

The foregoing object of the invention has been achieved by the provision of a closed container which accommodates wafers in an inert gas atmosphere, and is conveyed from one processing device to another in a semiconductor manufacturing system, in which, according to the invention, a gas passageway is formed in the container in such a manner that one end thereof is open inside the container and the other end is open outside the container, and a portable inert gas tank is detachably connected to the other end of the gas passageway, to supplement the container with the inert gas.

When the leakage of gas from the container advances, that is, when the internal pressure of the container is decreased to a predetermined value, the $N_2$ gas tank automatically supplements the container with the $N_2$ gas.

DETAILED DESCRIPTION OF THE PREFERRED EMBODIMENT

One embodiment of this invention will be described with reference to the accompanying drawings.

Figure 1:
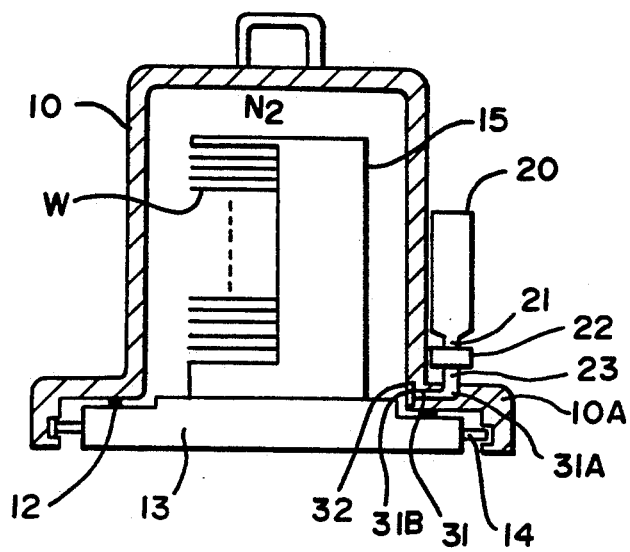
FIG. 1 is a sectional view showing one embodiment of this invention.

In FIG. 1, reference numeral 20 designates a gas supply source, namely, a portable small $N_2$ gas tank. A container 10 has a flange 10A, in which a small gas passageway 31 is formed in such a manner that its one end 31A is opened in the upper surface of the flange 10A, and the other 31B is opened in the inner surface of the container 10. A filter 32 is provided at the other end 31B of the gas passageway 31.

Figure 2:
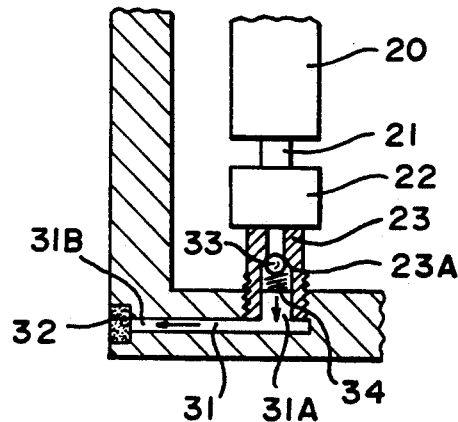
FIG. 2 is an enlarged sectional view showing essential components of the embodiment.
Figure 4:
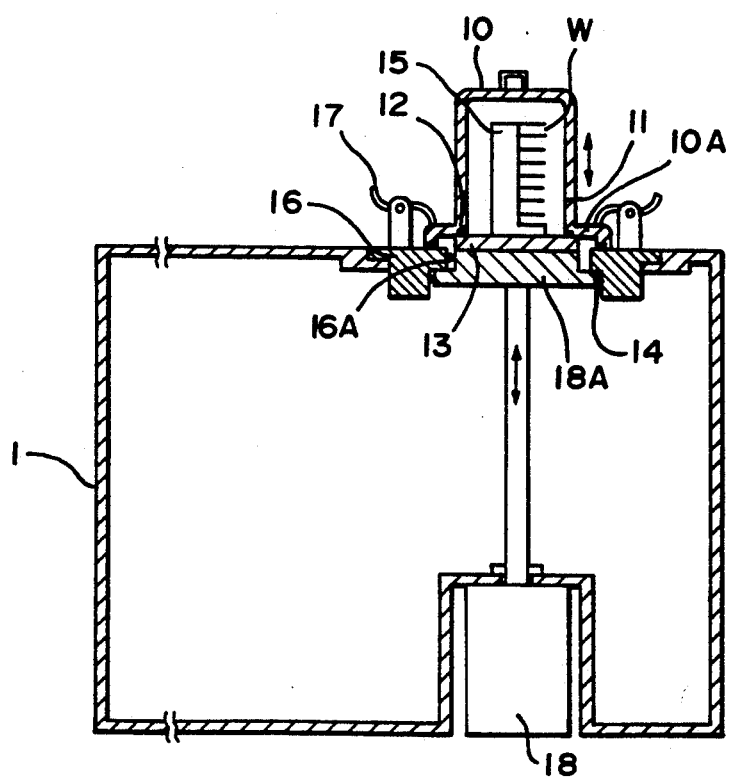
FIG. 4 is a sectional view showing a part of a surface treatment device in the semiconductor manufacturing system of FIG. 3.

The $N_2$ gas tank 20 has a nozzle 21 with a pressure reducing valve 22, from which a gas supply pipe 23 is extended. The gas supply pipe 23, as shown in FIG. 2, is threadably engaged with the gas passageway 31 at the one end 31A. In FIG. 2, reference numeral 33 designates a pressure control valve urged by a spring 34. In the preferred embodiment shown, pressure control valve 23 comprises a ball-type check valve.

At an $N_2$ gas purge station or the like, the closed container 10 thus constructed is gas-purged and filled with $N_2$ gas to a pressure slightly higher than the atmospheric pressure.

Figure 3:
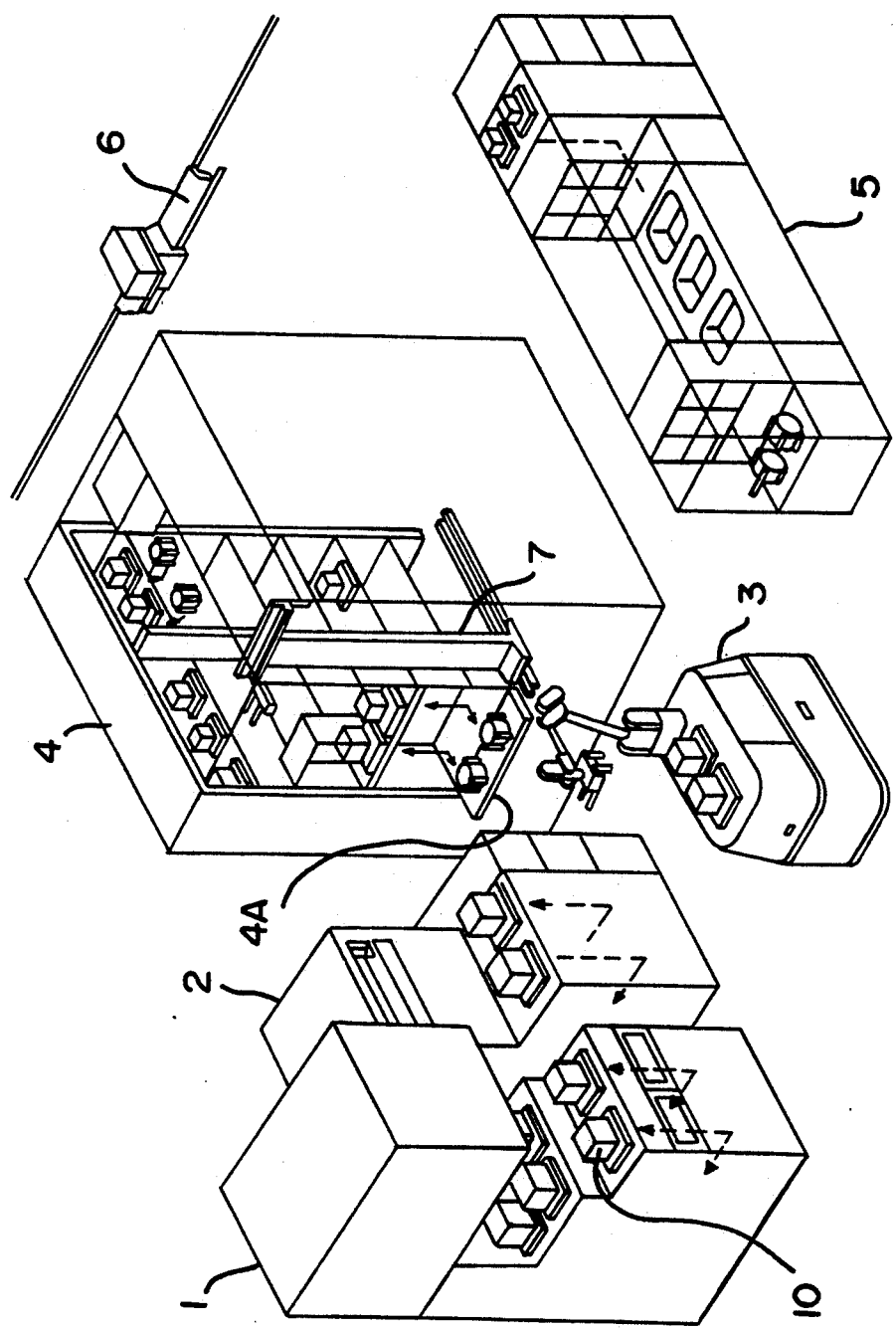
FIG. 3 is a perspective view showing the arrangement of one example of a semiconductor manufacturing system.

In the case where the container 10 is left set on the shelf in a wafer storehouse such as that shown in FIG. 3, the leakage of gas advances with time, and the internal pressure in the container 10 is therefore decreased. If the pressure in the container 10 is decreased, for instance, to the atmospheric pressure, the valve 33 is moved downwardly against the elastic force of the spring 34, that is, it is moved away from the opening 23A of the gas supply pipe 23. As a result, the $N_2$ gas is jetted from the $N_2$ gas tank 20 into the gas passageway 31 while its pressure is reduced to a value higher than the atmospheric pressure by the pressure reducing valve 22. The $N_2$ gas thus flows into the container 10 through the other end 31B of the gas passageway 31, thus increasing the density of $N_2$ gas in the container 10.

As was described above, when the leakage of gas from the container 10 advances, that is, when the internal pressure of the container 10 is decreased to a predetermined value, the $N_2$ gas tank 20 automatically supplements the container 10 with the gas. This eliminates the troublesome work related to conveying the container 10 to the $N_2$ gas purge station periodically, as the container 10 is automatically supplemented with $N_2$ gas.

As was described above, the inert gas tank is held connected to the container to supplement the latter with the inert gas. Hence, the purity of inert gas in the container is automatically maintained high at all times. Therefore, it is unnecessary to convey the container to the gas purge station to supplement it with the gas, which will decrease the load of the semiconductor manufacturing system as much.

What is claimed is:

1. A portable container adapted to store wafers in a clean room of a semiconductor manufacturing system comprising:
   a container body having an opening for accessing a storage area defined within said container;
   a lid member attached to said container body and adapted to extend across said opening so as to close said container;
   a seal member positioned between said lid member and said container body such that, when said lid member is positioned so as to extend across said opening, said storage area is sealed;
   a passage having a first end opening into said storage area and a second end opening outside of said container;
   a tank connected to the second end of said passage and supported by said container body so as to be portable therewith, said tank containing a pressurized supply of inert gas; and
   means for regulating the pressure of inert gas in said storage area such that, when an item is placed in said storage area, said container is sealed and said storage area is filled with an initial supply of inert gas, a supplemental supply of inert gas will automatically be discharged into said storage area from said tank upon a predetermined decrease in inert gas pressure within said storage area due to leakage.

2. A portable container as claimed in claim 1, further including a filter located in said passage between said tank and the first end of said passage.

3. A portable container as claimed in claim 1, wherein said pressure regulating means includes a pressure control valve positioned between said tank and the first end of said passage.

4. A portable container as claimed in claim 3, wherein said tank includes a discharge nozzle and said pressure control valve comprises a check valve including a check valve member biased by a spring into sealing engagement with said discharge nozzle to prevent the discharge of inert gas from said tank until the differential pressure between said tank and said storage area falls below a predetermined amount.

* * * * *